United States Patent
Baek et al.

(10) Patent No.: US 8,917,128 B1
(45) Date of Patent: Dec. 23, 2014

(54) PHASE DETERMINATION CIRCUIT AND DELAY LOCKED LOOP CIRCUIT USING THE SAME

(71) Applicant: SK Hynix Inc., Icheon-si Gyeonggi-do (KR)

(72) Inventors: Seung Geun Baek, Icheon-si (KR); Hoon Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/189,672

(22) Filed: Feb. 25, 2014

(30) Foreign Application Priority Data

Nov. 29, 2013 (KR) ........................ 10-2013-0147747

(51) Int. Cl.
*H03L 7/095* (2006.01)
*H03L 7/14* (2006.01)

(52) U.S. Cl.
CPC ....................................... *H03L 7/14* (2013.01)
USPC ........................................ 327/158; 327/149

(58) Field of Classification Search
USPC ............. 327/2, 3, 5, 7–10, 12, 147, 149, 156, 327/158; 331/25
See application file for complete search history.

(56) References Cited

U.S. PATENT DOCUMENTS

| | | | | |
|---|---|---|---|---|
| 7,321,649 B2 * | 1/2008 | Lee | ............................... | 375/376 |
| 7,323,946 B2 * | 1/2008 | Seefeldt et al. | ................. | 331/25 |
| 7,605,623 B2 * | 10/2009 | Yun et al. | ...................... | 327/158 |
| 7,724,050 B2 * | 5/2010 | Lee | ............................... | 327/158 |
| 7,990,194 B2 * | 8/2011 | Shim | ............................... | 327/158 |
| 8,085,072 B2 * | 12/2011 | Lee et al. | ...................... | 327/158 |
| 8,368,445 B2 | 2/2013 | Lin et al. | | |
| 8,754,686 B2 * | 6/2014 | Kwon et al. | .................. | 327/158 |
| 8,829,960 B2 * | 9/2014 | Na | ............................... | 327/158 |

FOREIGN PATENT DOCUMENTS

KR      1020110075357 A    7/2011

\* cited by examiner

*Primary Examiner* — Patrick O'Neill
(74) *Attorney, Agent, or Firm* — William Park & Associates Patent Ltd.

(57) ABSTRACT

A phase determination circuit includes a first phase comparison unit, a flag generation unit and a locking detector. The first phase comparison unit compares phases of a reference clock signal and a feedback clock signal and generates a first phase comparison signal. The flag generation unit generates a flag signal based on phases of the reference clock signal and a clock signal, and the first phase comparison signal. The locking detector prevents generation of a locking signal based on the first phase comparison signal.

19 Claims, 7 Drawing Sheets

FIG.2
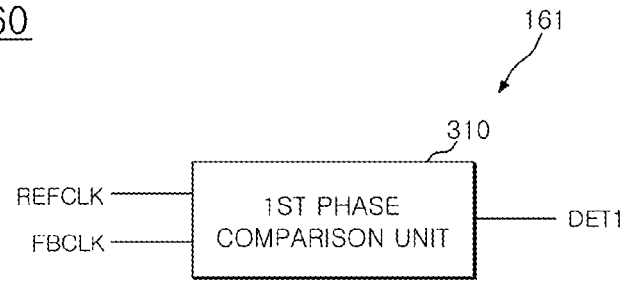
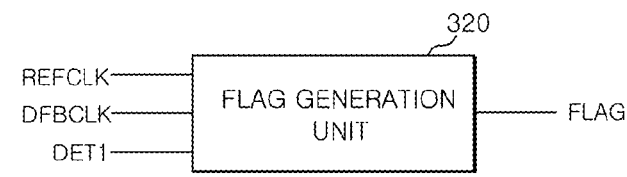
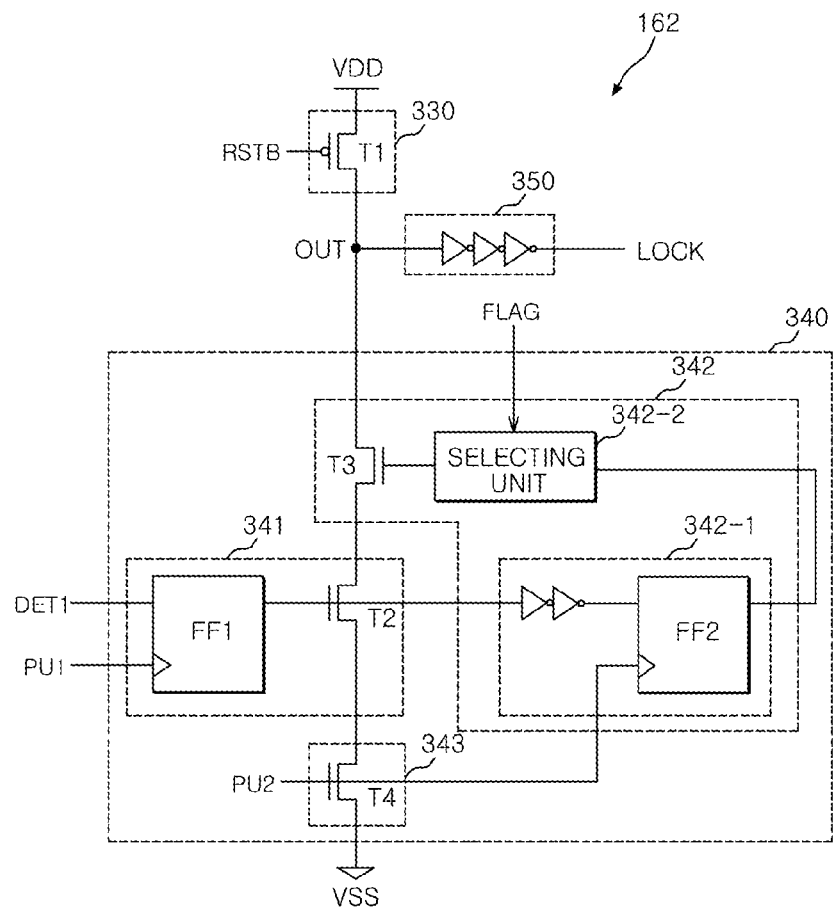

FIG.3
320
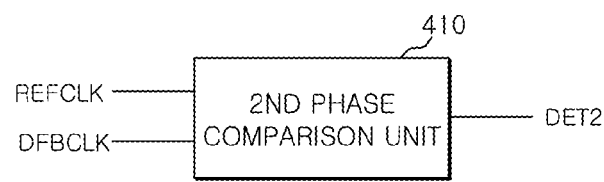
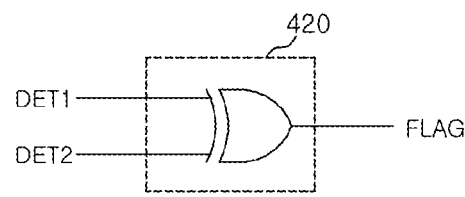

PHASE DETERMINATION CIRCUIT AND DELAY LOCKED LOOP CIRCUIT USING THE SAME

CROSS-REFERENCES TO RELATED APPLICATION

The present application claims priority under 35 U.S.C. §119(a) to Korean application number 10-2013-0147747 filed on Nov. 29, 2013 in the Korean Intellectual Property Office, which is incorporated herein by reference in its entirety as set forth in full.

BACKGROUND

1. Technical Field

Various embodiments relate to a semiconductor apparatus, and more particularly, to a delay locked loop circuit included in the semiconductor apparatus.

2. Related Art

Generally, a semiconductor apparatus such as a memory performs data communication with an external host apparatus such as a processor or a controller. The memory and host apparatus communicate data to each other synchronized with a system clock signal. The host apparatus is synchronized with the system clock signal and provides data to the memory and the memory is also synchronized with the system clock signal and provides data to the host apparatus. However, the system clock signal is apt to delay in the memory because there are a lot of logic circuits in the memory. Errors may occur during the data communication when data is output from the memory that is synchronized with the delayed system clock signal.

The memory in general includes a delay locked loop circuit in order to compensate a phase delay of the system clock signal. The delay locked loop circuit allows data to be synchronized with the system clock signal and output from the memory to the host apparatus by simulating an amount of delay of the system clock signal caused by internal circuits of the memory; and generating an internal clock signal where the delay of the system clock signal is compensated. The delay locked loop circuit includes a phase determination circuit configured to compare phases of the system clock signal and a feedback clock signal that is delayed by the simulated amount of delay. The delay locked loop circuit generates the internal clock signal based on the result of phase determination.

In a conventional phase determination circuit, anyone of a rising time point and a falling time point of anyone of a reference clock signal and a feedback clock signal is apt to change when power noise flows therein; or when a jitter of the reference clock signal or the feedback clock signal FBCLK occurs. Under such a circumstance, the conventional phase determination circuit may generate a phase determination signal of a high level by comparing an edge of a clock signal whose phase is changed due to the power noise or the jitter; and therefore the delay locked loop circuit may be locked incorrectly.

SUMMARY

In an embodiment, a phase determination circuit may include a first phase comparison unit that is configured to compare phases of a reference clock signal and a feedback clock signal and generate a first phase comparison signal. The phase determination unit may also include a flag generation unit configured to generate a flag signal based on phases of the reference clock signal and a clock signal, and the first phase comparison signal. Further, the phase determination unit may also include a locking detector configured to prevent generation of a locking signal based on the first phase comparison signal when the flag signal is enabled.

In an embodiment, a delay locked loop circuit may include a delay line configured to generate a delay clock signal by delaying a reference clock signal. The delay locked loop circuit may also include is a delay modelling unit configured to generate a feedback clock signal by delaying the delay clock signal by a modelled amount of time. A phase detector may also be included in the delay locked loop circuit, and be configured to generate a first phase comparison signal and a flag signal based on the reference clock signal and the feedback clock signal and a clock signal Further, the delay locked loop circuit may also include a locking detector configured to generate a locking signal based on the first phase comparison signal and the flag signal; and a delay line control unit configured to generate the delay control signal in response to the first phase comparison signal and the locking signal.

In an embodiment, a system comprises: a processor, a controller configured to receive a request and a data from the processor, and a memory unit configured to receive the request and the data from the controller. The memory unit may include a first phase comparison unit that is configured to compare phases of a reference clock signal and a feedback clock signal and generate a first phase comparison signal. The memory unit may also include a flag generation unit configured to generate a flag signal based on phases of the reference clock signal and a clock signal, and the first phase to comparison signal. Further the memory unit may also include a locking detector configured to prevent generation of a locking signal based on the first phase comparison signal when the flag signal is enabled.

BRIEF DESCRIPTION OF THE DRAWINGS

FIG. 2 is a block diagram illustrating an embodiment of a phase determination circuit shown in FIG. 1, FIG. 3 is a block diagram illustrating an embodiment of a flag generator shown in FIG. 2.

DETAILED DESCRIPTION

Hereinafter, a semiconductor apparatus will be described below with reference to the accompanying drawings through various embodiments.

Figure 1:
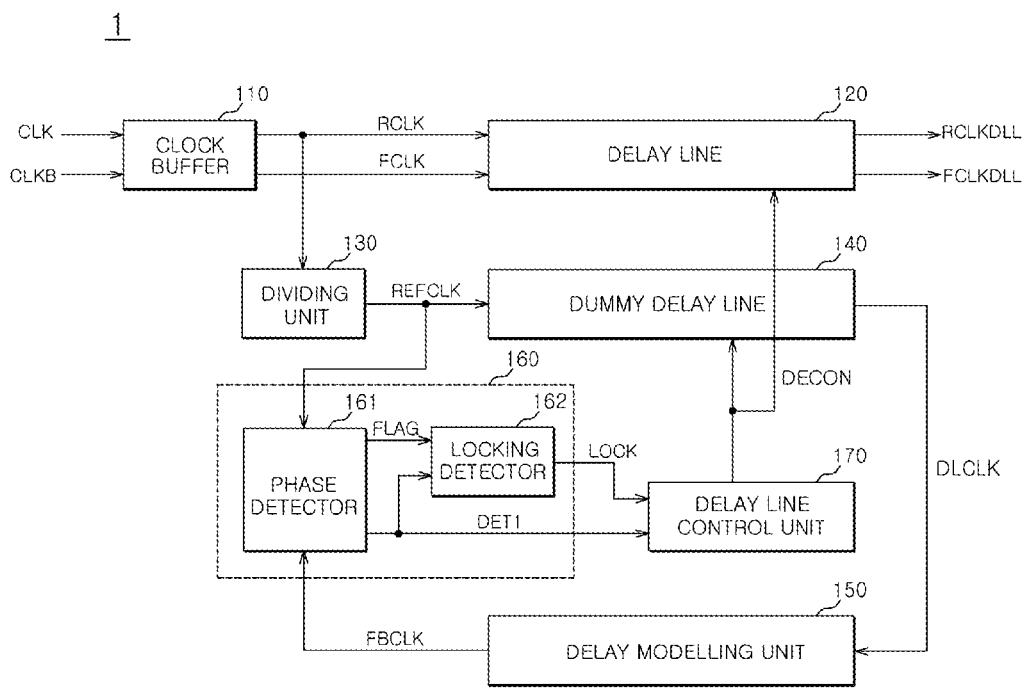
FIG. 1 is a block diagram illustrating a delay locked loop circuit in accordance with an embodiment.

Referring to FIG. 1, the delay locked loop circuit 1 may include a clock buffer 110, a delay line 120, a dividing unit 130, a dummy delay line 140, a delay modelling unit 150, a phase determination circuit 160 and a delay line control unit 170.

The clock buffer 110 may receive a system clock signals is and/or an external clock signals CLK and CLKB that may be used for communication between other external apparatuses and the semiconductor apparatus including the delay locked loop circuit 1. The clock buffer 110 may generate input clock signals RCLK and FCLK by buffering the system clock signals and/or an external clock signals CLK and CLKB.

The delay line 120 may generate internal clock signals RCLKDLL and FCLKDLL by delaying the input clock signals RCLK and FCLK in response to a delay control signal DECON. The system clock signals and/or an external clock signals CLK and CLKB, the input clock signals RCLK and FCLK, and the internal clock signals RCLKDLL and FCLKDLL may be a pair of differential clock signals.

The dividing unit 130 may generate a reference clock signal REFCLK by dividing the input clock signal RCLK. The dummy delay line 140 may generate a delay clock signal DLCLK by delaying the reference clock signal REFCLK in response to the delay control signal DECON. The dummy delay line 140 may have the same composition as the delay line 120 and commonly receive the delay control signal DECON. The dividing unit 130 and the dummy delay line 140 may perform delay-lock operation on the reference clock signal REFCLK; which is divided from the internal clock signals RCLKDLL and FCLKDLL, so that power consumption of the delay locked loop circuit 1 may be reduced.

The delay modelling unit 150 may generate a feedback clock signal FBCLK by delaying the delay clock signal DLCLK by a modelled amount of time. The modelled amount of time may be modelled on delay time that the system clock signals and/or an external clock signals CLK and CLKB inputted to the semiconductor apparatus may experience through internal circuits of the semiconductor apparatus. The phase determination circuit 160 may receive the reference clock signal REFCLK and the feedback clock signal FBCLK and generate a first phase comparison signal DET1 and a locking signal LOCK. The delay line control unit 170 may generate the delay control signal DECON in response to the first phase comparison signal DET1 and the locking signal LOCK.

As shown in FIG. 1, the phase determination circuit 160 may include a phase detector 161 and a locking detector 162. The phase detector 161 may receive the reference clock signal REFCLK and the feedback clock signal FBCLK and generate the first phase comparison signal DET1 and a flag signal FLAG. The phase detector 161 may compare phases of the reference clock signal REFCLK and the feedback clock signal FBCLK and generate the first phase comparison signal DET1. Also, the phase detector 161 may generate the flag signal FLAG based on phases of the reference clock signal REFCLK and a clock signal, which is the feedback clock signal FBCLK delayed to by preset amount of time, and the first phase comparison signal DET1. The clock signal or the feedback clock signal FBCLK delayed by the preset amount of time will be described later. The locking detector 162 may generate the locking signal LOCK in response to the first phase comparison signal DET1 and the flag signal FLAG. As described below, the phase detector 161 may generate the first phase comparison signal DET1 by comparing the phases of the reference clock signal REFCLK and the feedback clock signal FBCLK; and generate a second phase comparison signal DET2 by comparing the phases of the reference clock signal REFCLK and the clock signal or the feedback clock signal FBCLK delayed by the preset amount of time. Further, the phase detector 161 may disable the flag signal FLAG when levels of the first phase comparison signal DET1 and the second phase comparison signal DET2 are the same; and may enable the flag signal FLAG when the levels of the first phase comparison signal DET1 and the second phase comparison signal DET2 are different to each other. The locking detector 162 may prevent generation of the locking signal LOCK when the flag signal FLAG is enabled.

The delay line control unit 170 may generate the delay control signal DECON for increase or decrease of a delay amount of the delay line 120 and dummy delay line 140 in response to the first phase comparison signal DET1 provided from the phase determination circuit 160. The delay line 120 and the dummy delay line 140 may include a plurality of delay cells; and the delay control signal DECON may include a plurality of codes for determining whether or not to enable the plurality of delay cells. The delay line control unit 170 may maintain code value of the delay control signal DECON outputted in response to the locking signal LOCK provided from the phase determination circuit 160. The delay amount of the delay line 120 and the dummy delay line 140 may be fixed. Therefore, the delay locked loop circuit 1 may finish the delay-lock operation.

FIG. 2 is a block diagram illustrating an embodiment of the phase determination circuit 160 shown in FIG. 1. Referring to FIG. 2, the phase determination circuit 160 may include the phase detector 161 and the locking detector 162. The phase detector 161 may include a first phase comparison unit 310 and a flag generation unit 320. The first phase comparison unit 310 may compare phases of the reference clock signal REFCLK and the feedback clock signal FBCLK and generate the first phase comparison signal DET1. The flag generation unit 320 may generate the flag signal FLAG based on phases of the reference clock signal REFCLK and the clock signal DFBCLK. The clock signal DFBCLK may be the feedback clock signal FBCLK delayed by the preset amount of time, and the first phase comparison signal DET1. As described below, the flag signal FLAG may be generated based on a comparison result of the phases of the reference clock signal REFCLK and the clock signal DFBCLK. The clock signal DFBCLK is the feedback clock signal FBCLK delayed by the preset amount of time. The flag signal FLAG may prevent false locking of the delay locked loop circuit 1 due to an erroneous phase to determination result when the power noise flows in the delay locked loop circuit 1; or when the jitter of the reference clock signal REFCLK and/or the feedback clock signal FBCLK occurs. That is, the phase detector 161 may additionally compare the phases of the reference clock signal REFCLK and the clock signal DFBCLK, which is the feedback clock signal FBCLK delayed by the preset amount of time; and when it is determined that there is incorrect phase comparison result on the reference clock signal REFCLK, the phase detector 161 may prevent false locking of the delay locked loop circuit 1 due to the erroneous phase determination result. As an embodiment, the preset amount of time may be preferably shorter than half period of the feedback clock signal FBCLK, to which an embodiment should not be limited.

The locking detector 162 may include a precharge unit 330 and a locking enablement unit 340. The precharge unit 330 may precharge an output node OUT in response to a reset signal RSTB and may disable the locking signal LOCK as a result. The locking enablement unit 340 may enable the locking signal LOCK by discharging the output node OUT based on the first phase comparison signal DET1 and the flag signal FLAG. The locking enablement unit 340 may include a first sink unit 341 and a second sink unit 342. The first sink unit 341 may be coupled to a ground voltage VSS and generate a current path between the second sink unit 342 and the ground voltage VSS based on the first phase comparison signal DET1. The second sink unit 342 may be coupled between the output node OUT and the first sink unit 341; and generate a current path between the output node OUT and the first sink unit 341 based on the first phase comparison signal DET1 and the flag signal FLAG. The locking detector 162 may further include the third sink unit 343 capable of generating a current path between the first sink unit 341 and the ground voltage VSS in response to a timing control signal PU2.

Referring to FIG. 2, the precharge unit 330 may include a first transistor T1. The first transistor T1 may receive the reset signal RSTB at its gate and a power voltage VDD at its source. A drain of the first transistor T1 may be coupled to the output node OUT. Therefore, the first transistor T1 may drive the output node OUT to level of the power voltage VDD when turned on by the reset signal RSTB.

The first sink unit 341 may include a first flip-flop FF1 and a second transistor T2. The first flip-flop FF1 may output the first phase comparison signal DET1 in response to a timing control signal PU1. The second transistor T2 may receive the output of the first flip-flop FF1 at its gate. A source of the second transistor T2 may be coupled to the ground voltage VSS via the third sink unit 343 and a drain of the second transistor T2 may be coupled to the first sink unit 341. The timing control signals PU1 and PU2 may be generated in the delay locked loop circuit 1 based on the reference clock signal REFCLK for sequential operations of elements of the locking detector 162. The timing control signals PU1 and PU2 may be plural signals having different enable timing to each other. As an example, it is preferable that the timing control signal PU1 is enabled prior to the timing control signal PU2.

The second sink unit 342 may include a delay unit 342-1, a selection unit 342-2 and a third transistor T3. The delay unit 342-1 may include a plurality of inverters and a second flip-flop FF2. The plurality of inverters may delay the output of the first flip-flop FF1. The second flip-flop FF2 may transfer the output of the plurality of inverters to the selection unit 342-2 in response to the timing control signal PU2. The selection unit 342-2 may selectively transfer the output of the second flip-flop FF2 with a delayed first phase comparison signal to the third transistor T3 in response to the flag signal FLAG. The selection unit 342-2 may provide the output of the second flip-flop FF2 to the third transistor T3 when the flag signal FLAG is disabled; and may stop providing the output of the second flip-flop FF2 to the third transistor T3 when the flag signal FLAG is enabled. The third transistor T3 may receive the output of the selection unit 342-2 at its gate. A drain of the third transistor T3 may be coupled to the output node OUT and a source of the third transistor T3 may be coupled to the first sink unit 341 or the drain of the second transistor T2.

The third sink unit 343 may include a fourth transistor T4. The fourth transistor T4 may receive the timing control signal PU2. A drain of the fourth transistor T4 may be coupled to the source of the second transistor T2. A source of the fourth transistor T4 may be coupled to the ground voltage VSS.

The locking detector 162 may further include an output unit 350. The output unit 50 may be coupled to the output node OUT and may generate the locking signal LOCK by driving voltage of the output node OUT. The output unit 350 may comprise a plurality of inverters. As an embodiment, the output unit 350 may generate the locking signal LOCK having an opposite level to the voltage level of the output node OUT.

FIG. 3 is a block diagram illustrating an embodiment of the flag generation unit 320 shown in FIG. 2. Referring to FIG. 3, the flag generation unit 320 may include a second phase comparison unit 410 and a signal combination unit 420. The second phase comparison unit 410 may compare phases of the reference clock signal REFCLK and the clock signal DFBCLK (which is the feedback clock signal FBCLK delayed by the preset amount of time), and generate the second phase comparison signal DET2. The signal combination unit 420 may receive the first phase comparison signal DET1 and the second phase comparison signal DET2. The signal combination unit 420 may disable the flag signal FLAG when the levels of the first and second phase comparison signals DET1 and DET2 are the same as each other; and may enable the flag signal FLAG when the levels of the first and second phase comparison signals DET1 and DET2 are different to each other. The signal combination unit 420 may include an XOR gate.

Figure 4:
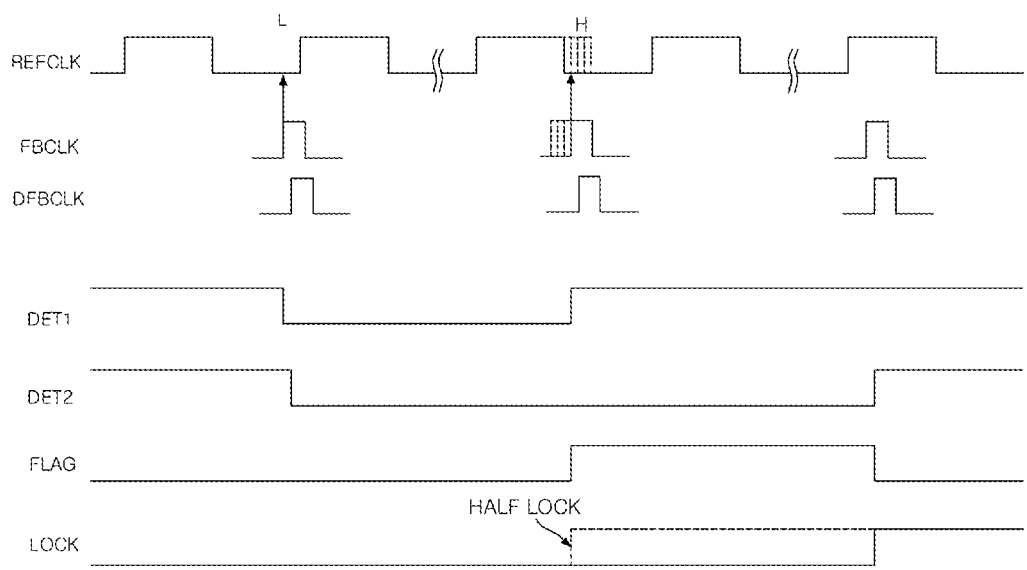
FIG. 4 is a timing diagram illustrating operation of a delay locked loop circuit in accordance with an embodiment.

FIG. 4 is a timing diagram illustrating operation of the delay locked loop circuit 1 in accordance with an embodiment. The operation of the delay locked loop circuit 1 is described as follows with reference to FIGS. 1 to 4. When the delay locked loop circuit 1 begins its operation, the phase determination circuit 160 may receive the reference clock signal REFCLK and the feedback clock signal FBCLK. The reference clock signal REFCLK may be of a low level L at a rising edge of the feedback clock signal FBCLK and thus the phase detector 161 may output the first phase comparison signal DET1 having low level. After that, phase change(s) of the reference clock signal REFCLK and/or the feedback clock signal FBCLK may occur due to the power noise or the jitter, which is shown as a dotted line in the figure. The reference clock signal REFCLK may be of a high level H at a second rising edge of the feedback clock signal FBCLK and the phase detector 161 may output the first phase comparison signal DET1 having high level. According to conventional technique, there may occur an erroneous locking of a delay locked loop circuit like the half lock HALF LOCK because the locking signal LOCK is enable according to the first phase comparison signal DET1. In accordance with an embodiment, the second phase comparison unit 410 may output the second phase comparison signal DET2 having low level because the reference clock signal REFCLK is of low level at a rising edge of the clock signal DFBCLK (which is the feedback clock signal FBCLK delayed by the preset amount of time). When the first phase comparison signal DET1 is output with high level and the second phase comparison signal DET2 is output with low level, the first phase comparison signal DET1 may be determined to be a faulty result of phase determination; and the signal combination unit 420 may enable the flag signal FLAG. The selection unit 342-2 of the locking enablement unit 340 may prevent transfer of the output of the second flip-flop FF2 to the third transistor T3 in response to the enabled flag signal FLAG. Therefore, the flag signal FLAG may stay disabled.

After that, the first and second phase comparison units 161 and 410 may output the first and second phase comparison signals DET1 and DET2 having high levels, respectively because the reference clock signal REFCLK is of a high level H at a third rising edge of the clock signal DFBCLK (which is the feedback clock signal FBCLK delayed by the preset amount of time). The signal combination unit 420 may disable the flag signal FLAG and the output of the second flip-flop FF2 may be provided to the third transistor T3 through the selection unit 342-2. When the third transistor T3 receives the output of the second flip-flop FF2, the output node OUT may be discharged because of a current path from the output node OUT to the ground voltage VSS. Therefore, the locking signal LOCK, which is enabled through the output unit 350, may be generated. The delay line control unit 170 may maintain a code value of the delay control signal DECON provided to the delay line 120 and the dummy delay line 140, in response to the locking signal LOCK; and the delay locking operation of the delay locked loop circuit 1 may be to be finished.

Figure 5:
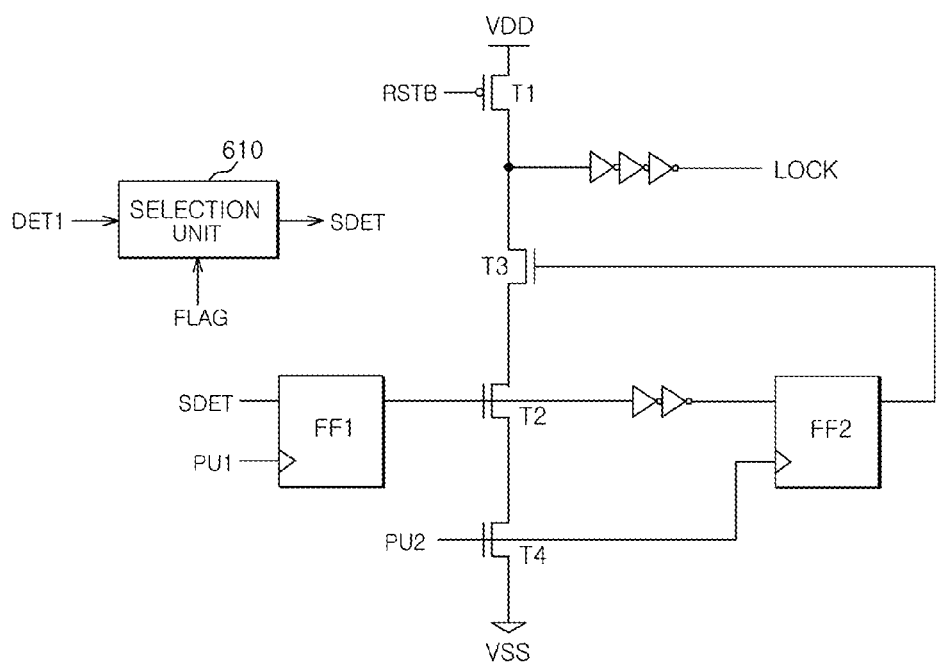
FIG. 5 is a block diagram illustrating an embodiment of a locking detector shown in FIG. 1.
Figure 6:
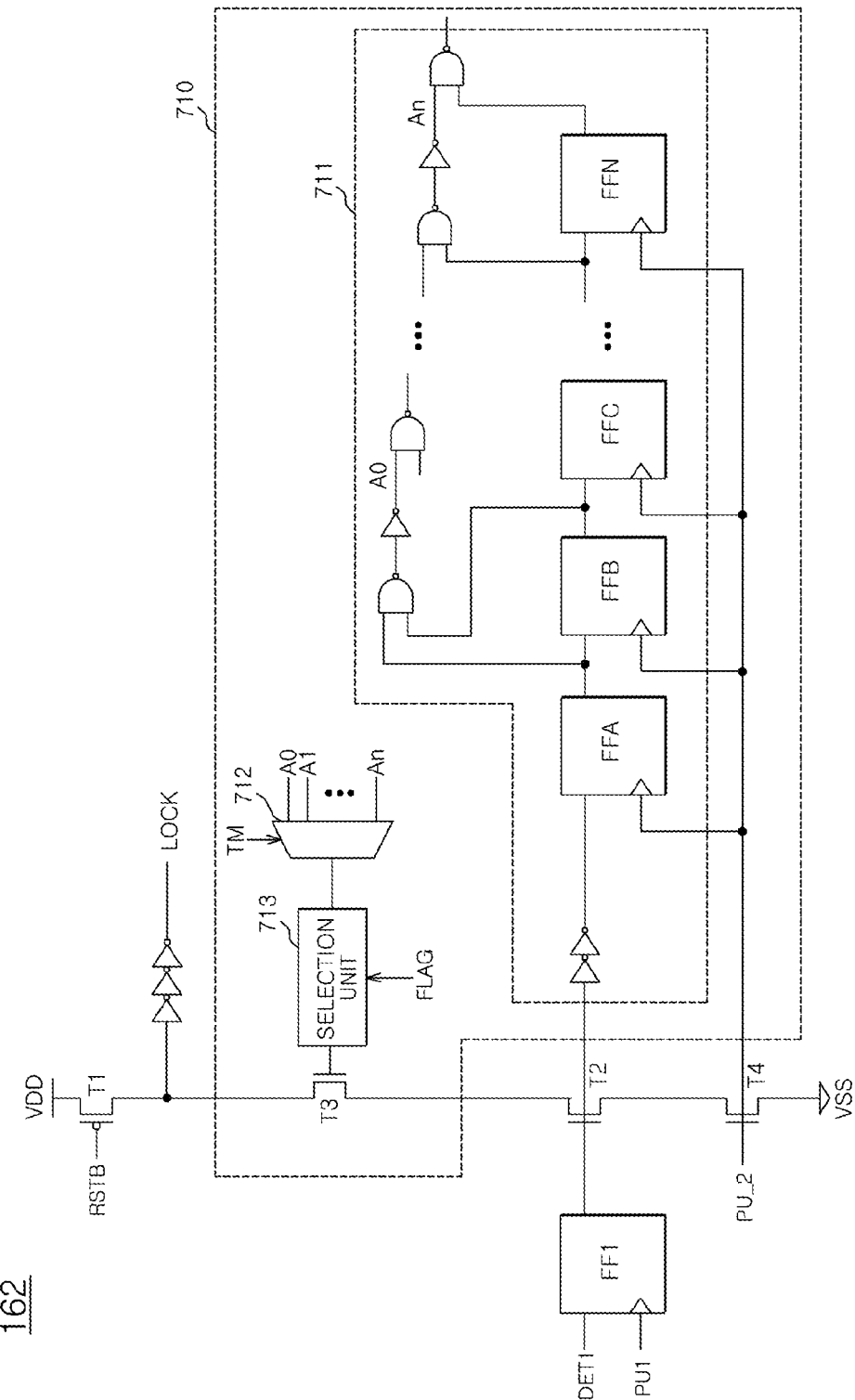
FIG. 6 is a block diagram illustrating an embodiment of a locking detector shown in FIG. 1.

FIG. 5 is a block diagram illustrating an embodiment of the locking detector 162 shown in FIG. 2. The locking detector 162 shown in FIG. 6 is the same as the locking detector 162 described with reference to FIG. 2 except for a selection unit 610 shown in FIG. 5. Elements of the same reference numbers of the locking detector 162 shown in FIG. 5 as FIG. 2 are the same as described with reference to FIG. 2, description of which is omitted. Referring to FIG. 5, the selection unit 610 may not be coupled to the third transistor T3 and may be individually disposed. The selection unit 610 may generate a selection phase comparison signal SDET in response to the first phase comparison signal DET1 and the flag signal FLAG. The selection unit 610 may output the first phase comparison signal DET1 as the selection phase comparison signal SDET when the flag signal FLAG is disabled. When both of the first and second phase comparison signals DET1 and DET2 are of high levels, the selection phase comparison signal SDET may be provided to the first flip-flop FF1 in response to the disabled flag signal FLAG. Therefore, the locking detector 162 may prevent an erroneous locking of the delay locked loop circuit such as the half lock.

FIG. 6 is a block diagram illustrating an embodiment of the locking detector 162 shown in FIG. 1. The locking detector 162 shown in FIG. 6 is the same as the locking detector 162 described with reference to FIG. 2 except for a second sink unit 710 shown in FIG. 6. Elements of the same reference numbers of the locking detector 162 shown in FIG. 6 as FIG. 2 are the same as described with reference to FIG. 2, description of which is omitted. Referring to FIG. 6, the second sink unit 710 of the locking detector 162 may include a delay unit 711, a mux unit 712, a selection unit 713 and a third transistor T3. The delay unit 711 may include a plurality of inverters, a plurality of flip-flops FFA to FFN and a plurality of logic gates. The plurality of inverters may buffer the output of the first flip-flop FF1, which is based on the first phase comparison signal DET1; and the plurality of flip-flops FFA to FFN may sequentially delay the output of the first flip-flop FF1 in response to a timing control signal PU1. The plurality of logic gates may receive the outputs of the plurality of flip-flops FFA to FFN, respectively. The plurality of logic gates may generate a plurality of delayed phase comparison signals AO to An having high levels when the outputs of the plurality of flip-flops FFA to FFN are consecutively of high levels. The mux unit 712 may output one of the plurality of delayed phase comparison signals AO to An in response to a control signal TM. The selection unit 713 may provide the output of the mux unit 712 to the third transistor T3 in response to the flag signal FLAG. The plurality of flip-flops FFA to FFN and the plurality of logic gates may secure time duration for determination whether or not the first phase comparison signal DET1 is a correct result of phase determination. Also, the control signal TM may select one of the plurality of delayed phase comparison signals AO to An or the outputs of the plurality of logic gates; and thus may control the time duration for determination whether or not the first phase comparison signal DET1 is a correct result of phase determination.

Figure 7:
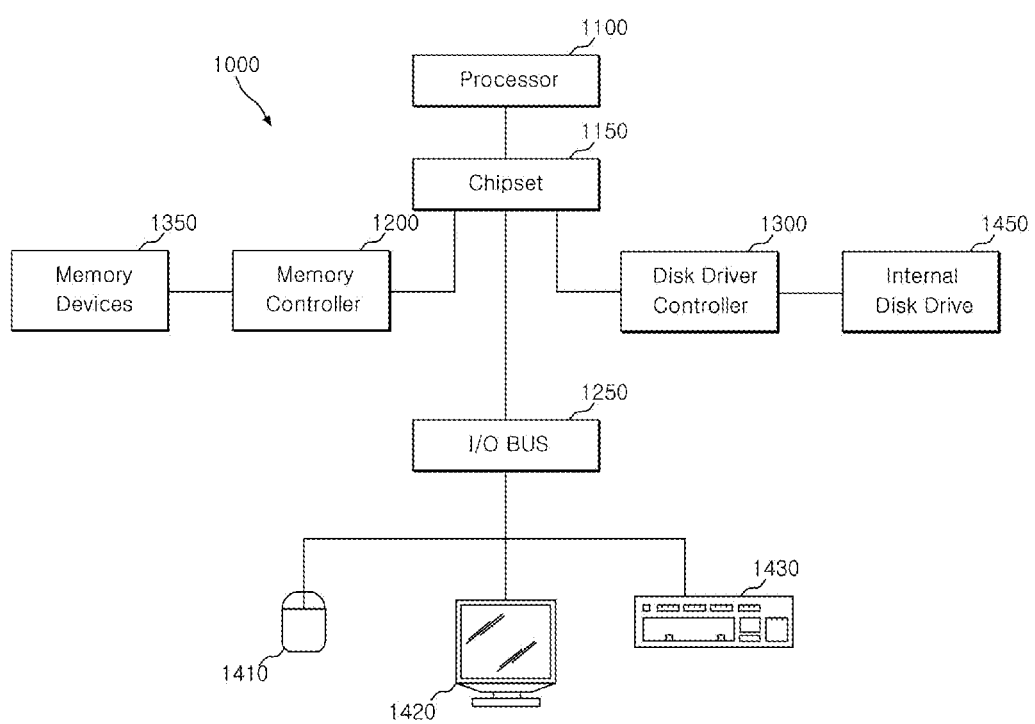
FIG. 7 illustrates a block diagram of a system employing a memory controller circuit in accordance with an embodiment.

Referring to FIG. 7, a system 1000 may include one or more to processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 1150 and one or more internal disk drives 1450. The internal disk drive 1450 and the disk drive controller 1300 may communicate with each other or with the chipset using virtually any type of communication protocol.

While certain embodiments have been described above, it will be understood to those skilled in the art that the embodiments is described are by way of example only. Accordingly, the phase determination circuit and the delay locked loop circuit using the same described herein should not be limited based on the described embodiments. Rather, the phase determination circuit and the delay locked loop circuit using the same described herein should only be limited in light of the claims that follow when taken in conjunction with the above description and accompanying drawings.

What is claimed is:

1. A phase determination circuit comprising:
   a first phase comparison unit configured to compare phases of a reference clock signal and a feedback clock signal and generate a first phase comparison signal;
   a flag generation unit configured to generate a flag signal based on phases of the reference clock signal and a clock signal, and the first phase comparison signal; and
   a locking detector configured to prevent generation of a locking signal based on the first phase comparison signal when the flag signal is enabled.

2. The phase determination circuit of claim 1, wherein the flag is generation unit comprises:
   a second phase comparison unit configured to compare phases of the reference clock signal and the clock signal, which is the feedback clock signal delayed by a preset amount of time, and generate a second phase comparison signal; and
   a signal combination unit configured to generate the flag signal in response to the first and second phase comparison signals.

3. The phase determination circuit of claim 2, wherein the flag generation unit enables the flag signal when levels of the first and second phase comparison signals are different.

4. The phase determination circuit of claim 1, wherein the locking detector comprises:
   a precharge unit configured to disable the locking signal by precharging an output node; and
   a locking enablement unit configured to enable the locking signal by discharging the output node in response to the first phase comparison signal and the flag signal.

5. The phase determination circuit of claim 4, wherein the locking enablement unit comprises:
   a first sink unit configured to generate a current path in response to the first phase comparison signal; and a second sink unit configured to generate a current path in response to the first phase comparison signal and the flag signal.

6. The phase determination circuit of claim 5, wherein the second sink unit comprises:
   a delay unit configured to delay the first phase comparison signal; and
   a selection unit configured to selectively output the delayed first phase comparison signal in response to the flag signal.

7. The phase determination circuit of claim 5, wherein the second sink unit comprises:
   a delay unit configured to generate a plurality of delayed phase comparison signals by sequentially delaying the first phase comparison signal;
   a mux unit configured to output one of the plurality of delayed phase comparison signals; and
   a selection unit configured to selectively output an output of the mux unit in response to the flag signal.

8. The phase determination circuit of claim 5, further comprising:
   a third sink unit configured to generate a current path between the first sink unit and the ground voltage.

9. The phase determination circuit of claim 4, wherein the is locking enablement unit comprises:
   a selection unit configured to generate a selection phase comparison signal from the first phase comparison signal in response to the flag signal;
   a first sink unit coupled to a ground voltage and configured to generate a current path based on the selection phase comparison signal; and
   a second sink unit configured to generate a current path between the output node and the first sink unit based on the selection phase comparison signal.

10. The phase determination circuit of claim 9, wherein the second sink unit comprises:
    a delay unit configured to delay the selection phase comparison signal.

11. The phase determination circuit of claim 9, further comprising:
    a third sink unit configured to generate a current path between the first sink unit and the ground voltage.

12. A delay locked loop circuit comprising:
    a delay line configured to generate a delay clock signal by delaying a reference clock signal;
    a delay modelling unit configured to generate a feedback clock signal by delaying the delay clock signal by a modelled amount of time;
    a phase detector configured to generate a first phase comparison signal and a flag signal based on the reference clock signal and the feedback clock signal and a clock signal;
    a locking detector configured to generate a locking signal based on the first phase comparison signal and the flag signal; and
    a delay line control unit configured to generate the delay control signal in response to the first phase comparison signal and the locking signal.

13. The delay locked loop circuit of claim 12, wherein the phase detector generates the first phase comparison signal by comparing phases of the reference clock signal and the feedback clock signal; generates a second phase comparison signal by comparing phases of the reference clock signal and the clock signal, which is the feedback clock signal delayed by a preset amount of time; and enables the flag signal when levels of the first and second phase comparison signals are different.

14. The delay locked loop circuit of claim 13, wherein the locking detector prevents generation of the locking signal when the flag signal is enabled.

15. The delay locked loop circuit of claim 13, wherein the phase detector is configured to disable the flag signal when the levels of the first phase comparison signal and the second phase comparison signal are substantially the same.

16. The delay locked loop circuit of claim 12, wherein the phase is detector comprises:
    a first phase comparison unit configured to compare phases of the reference clock signal and the feedback clock signal and generate the first phase comparison signal; and
    a flag generation unit configured to generate the flag signal based on phases of the reference clock signal and the clock signal, which is the feedback clock signal delayed by the preset amount of time, and the first phase comparison signal.

17. The delay locked loop circuit of claim 16, wherein the flag generation unit comprises:
    a second phase comparison unit configured to compare phases of the reference clock signal and the clock signal, which is the feedback clock signal delayed by the preset amount of time, and generate a second phase comparison signal; and
    a signal combination unit configured to generate the flag signal in response to the first and second phase comparison signals.

18. The delay locked loop circuit of claim 17, wherein the phase detector enables the flag signal when levels of the first and second phase comparison signals are different.

19. The delay locked loop circuit of claim 12, wherein the locking detector further comprises:
    a selection unit configured to prevent an output from being provided when the flag signal is enabled.

* * * * *